(12) United States Patent
Freitag et al.

(10) Patent No.: US 7,408,803 B2
(45) Date of Patent: Aug. 5, 2008

(54) METHOD FOR WRITING TO MAGNETORESISTIVE MEMORY CELLS AND MAGNETORESISTIVE MEMORY WHICH CAN BE WRITTEN TO BY THE METHOD

(75) Inventors: Martin Freitag, München (DE); Stefan Miethaner, Regensburg (DE); Wolfgang Raberg, Fontainebleau (FR)

(73) Assignee: Infineon Technologies AG, Munich (DE)

( * ) Notice: Subject to any disclaimer, the term of this patent is extended or adjusted under 35 U.S.C. 154(b) by 510 days.

(21) Appl. No.: 10/642,856

(22) Filed: Aug. 18, 2003

(65) Prior Publication Data

US 2006/0171196 A1  Aug. 3, 2006

Related U.S. Application Data

(63) Continuation of application No. PCT/DE02/00255, filed on Jan. 24, 2002.

(30) Foreign Application Priority Data

Feb. 16, 2001  (DE) ............................... 101 07 380

(51) Int. Cl.
  *G11C 11/00*  (2006.01)
(52) U.S. Cl. ...................................... 365/158; 365/171
(58) Field of Classification Search ................. 365/158
  See application file for complete search history.

(56) References Cited

U.S. PATENT DOCUMENTS

| 3,375,503 | A | 3/1968 | Bertelsen |
| 4,547,866 | A | 10/1985 | Lutes et al. |
| 5,864,498 | A | 1/1999 | Womack |
| 6,363,000 | B2 * | 3/2002 | Perner et al. ................... 365/66 |
| 6,509,621 | B2 * | 1/2003 | Nakao ......................... 257/421 |
| 6,606,262 | B2 * | 8/2003 | Perner ......................... 365/158 |

FOREIGN PATENT DOCUMENTS

| DE | 198 23 826 A1 | 12/1999 |
| JP | 50-33623 | 3/1975 |

* cited by examiner

*Primary Examiner*—Huan Hoang
*Assistant Examiner*—Kretelia Graham
(74) *Attorney, Agent, or Firm*—Laurence A. Greenberg; Werner H. Stemer; Ralph E. Locher

(57) ABSTRACT

A method for writing to the magnetoresistive memory cells of a MRAM memory, includes applying write currents respectively onto a word line and a bit line. A superposition of the magnetic fields generated by the write currents in each memory cell selected by the corresponding word lines and bits lines alter a direction of the magnetization thereof. According to the method, the write currents are applied in a chronologically offset manner, to the corresponding word line and the bit line whereby the direction of magnetization of the selected memory cell is rotated in several consecutive steps in the desired direction for writing a logical "0" or "1".

6 Claims, 3 Drawing Sheets

FIG. 1
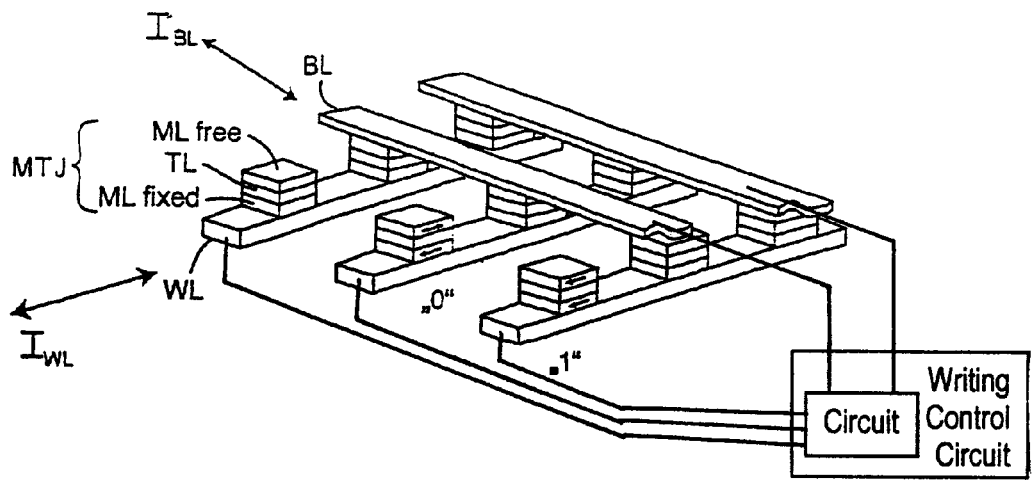
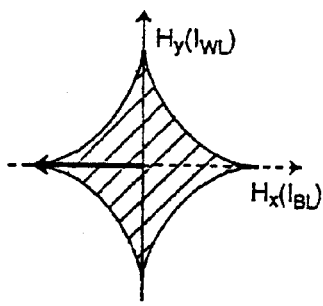
FIG. 2A
Prior Art
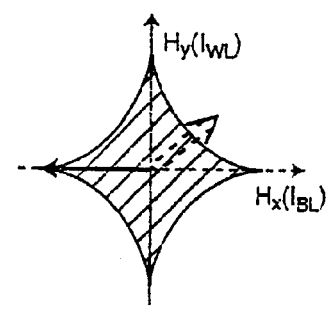
FIG. 2B
Prior Art
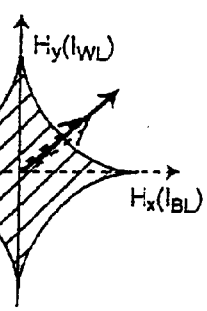
FIG. 2C
Prior Art
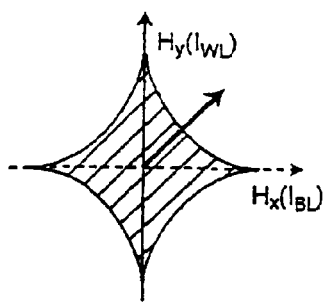
FIG. 2D
Prior Art
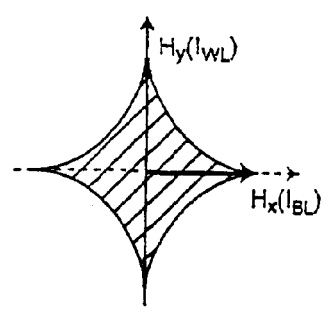
FIG. 2E
Prior Art

METHOD FOR WRITING TO MAGNETORESISTIVE MEMORY CELLS AND MAGNETORESISTIVE MEMORY WHICH CAN BE WRITTEN TO BY THE METHOD

CROSS-REFERENCE TO RELATED APPLICATION

This application is a continuation of copending International Application No. PCT/DE02/00255, filed Jan. 24, 2002, which designated the United States and was not published in English.

BACKGROUND OF THE INVENTION

Field of the Invention

In magnetoresistive memories (MRAM), the memory effect resides in the magnetically variable electrical resistance of the memory cell (MTJ). In one embodiment, a magnetoresistive memory cell lies at the crossover of two conductors, a bit line and a word line, which are generally disposed orthogonally to one another. Situated at the crossover point between these conductors is a multilayered system containing the stacking one above the other of a soft-magnetic layer and hard-magnetic layer and between which a tunnel oxide layer is situated (the cross-point concept). Information is stored by the magnetization of the soft-magnetic layer (ML-free) being rotated relative to the magnetization direction of the hard-magnetic layer (ML-fixed). The magnetic fields required for this purpose are generated by currents and which respectively flow through the word line and the bit line and are superposed at the crossover point thereof.

U.S. Pat. No. 3,375,503 describes a word-organized magnetic thin-film memory. FIGS. 1 and 2 of this document show a memory cell containing magnetostatically coupled magnetic thin films constructed in such a way that they form a magnetically closed magnetic circuit and their easy magnetization direction is oriented parallel to one another. In accordance with FIG. 3 of this document, the word lines are led in the direction of the easy magnetization axis specified by the vector 118, while the bit lines run perpendicular thereto, that is to say in the hard magnetization direction (vector 112). In the absence of external magnetization, the remanent magnetization of the two magnetic thin films is oriented in the easy magnetization direction. In accordance with FIG. 4 of the document, first a positive pulse on a word line (Right "1") causes all the bits present on the word line to be rotated in the hard magnetization direction 112, that is to say through 90° with respect to the easy magnetization direction 118. Both magnetic thin films are influenced in this case. Before the end of the positive current pulse, a positive bit pulse is then passed on to the selected bit sense line and the current pulse on the word line is ended before the bit pulse is ended. By this measure, the magnetization vector of both magnetic films is rotated in the direction desired for writing a "1", that is to say in the easy magnetization direction. Thus, the driving method which is described in this document and is shown in FIG. 4 thereof does not differ from the driving methods that are generally customary for magnetic thin-film memories. This is because the purpose of delaying the bit pulse with respect to the word pulse is that, at the beginning of the word pulse, the read current on the bit line simultaneously serving as sense line can be detected by a sense amplifier provided for this and that the information, which, under certain circumstances, is destroyed by the word line pulse, is written back to the memory cell again immediately afterwards. Consequently, although the document describes a driving method by which the write currents are impressed on the respective word line and bit line in a temporally offset manner, so that the magnetization direction of the selected memory cell is rotated in precisely two successive steps in the direction desired for writing a logic "0" or "1", this document in no way describes a method for writing to magnetoresistive memory cells of an MRAM memory in which the memory cells are formed from a multilayer system containing the stacking one above the other of a soft-magnetic and hard-magnetic material between which a tunnel oxide is situated.

SUMMARY OF THE INVENTION

It is accordingly an object of the invention to provide a method for writing to magnetoresistive memory cells and a magnetoresistive memory which can be written to by the method which overcome the above-mentioned disadvantages of the prior art methods and devices of this general type, which avoids the ageing phenomenon, which thus increases the service life of an MRAM memory and, compared with the customary half-select method, switches more reliably, and also to specify an MRAM memory which can be written to by a method according to the invention.

With the foregoing and other objects in view there is provided, in accordance with the invention, a method for writing to magnetoresistive memory cells of an MRAM memory. The magnetoresistive memory cells has a multilayer system containing layers stacked one above another. The layers include a soft-magnetic layer, a hard-magnetic layer and a tunnel oxide layer disposed between the soft-magnetic layer and the hard-magnetic layer. The method includes impressing write currents being in each case impressed on a respective word line and a respective bit line resulting in a superposition of magnetic fields generated by the write currents. In each selected memory cell selected by the respective word line and the respective bit line, a magnetic field leads to a change of a magnetization direction of only the soft-magnetic layer. The write currents are impressed on the respective word line and the respective bit line in a manner temporally offset with respect to one another, resulting in the magnetization direction of the soft-magnetic layer in the selected memory cell being rotated in a plurality of successive steps in a direction desired for writing a logic "0" or "1".

The above object is achieved, in accordance with a first essential aspect of the invention, by a method for writing to magnetoresistive memory cells of an MRAM memory. In which the memory cells are in each case formed from a multilayer system containing the stacking one above the other of a soft-magnetic layer and a hard-magnetic layer between which a tunnel oxide layer is situated. Write currents are in each case impressed on a word line and a bit line resulting in a superposition of magnetic fields generated by the write currents. In each memory cell selected by the corresponding word and bit lines, the magnetic field leads to the change of the magnetization direction of only the soft-magnetic material forming the soft-magnetic layer. More specifically, the write currents are impressed on the word line and bit line in a manner temporally offset with respect to one another, in such a way that the magnetization direction of the soft-magnetic material in the selected memory cell is rotated in a plurality of successive steps in the direction desired for writing a logic "0" or "1".

The method according to the invention can advantageously be developed by the fact that the write currents of the selected memory cell are impressed in each case in approximately the same pulse duration and in a manner temporally offset with respect to one another.

The method according to the invention can then be carried out in such a way that, in order to write a logic "1", the write current in the bit line flows in the same current flow direction as the write current in the word line and is impressed in a delayed manner relative to the write current of the word line.

In accordance with a second essential aspect of the invention, the above object is achieved by an MRAM memory configuration having an array containing magnetoresistive memory cells that are formed from a multilayer system. The multilayer system contains a stacking one above the other of a soft-magnetic and hard-magnetic material, between which a tunnel oxide is situated. Word lines and bit lines are provided and cross one another at each memory cell. A writing control circuit is set up for impressing write currents in each case onto the word line and bit line of a memory cell selected for writing. The writing control circuit has a circuit which impress the write currents in each case on the corresponding word line and the corresponding bit line in a manner temporally offset with respect to one another, in such a way that the magnetization direction of only the soft-magnetic material of the selected memory cell is rotated in a plurality of successive steps in the direction desired for writing a logic "0" or "1".

Other features which are considered as characteristic for the invention are set forth in the appended claims.

Although the invention is illustrated and described herein as embodied in a method for writing to magnetoresistive memory cells and a magnetoresistive memory which can be written to by the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, perspective view of a basic construction of an MRAM memory configuration;

FIGS. 2A-2E are graphs showing the switching of a magnetization direction in the case of a known half-select method;

DESCRIPTION OF THE PREFERRED EMBODIMENTS

Figure 3A:
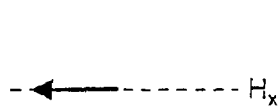
FIGS. 3A-3H are illustrations showing an exemplary embodiment of a writing method according to the invention by application of a temporally controlled external magnetic field.

Referring now to the figures of the drawing in detail, the description below presupposes, by way of example, an MRAM memory configuration constructed in accordance with FIG. 1. However, it must be noted that the method according to the invention can also be applied to differently constructed MRAMs in which the magneto-resistive memory cell is not disposed directly at a crossover point between a bit line and a word line and in which a selection transistor or a selection diode is additionally driven by a corresponding selection line.

FIG. 1 shows a section of an MRAM memory configuration that is constructed in such a way and contains a matrix configuration of the memory cells described above. In order to ensure that only one selected memory cell MTJ is written to, a magnetic field must be chosen precisely large enough that the superposition of the magnetic fields of a word line current $I_{WL}$ and a bit line current $I_{BL}$ through a selected word line WL and bit line BL suffices for switching the magnetization, but be chosen small enough that neither adjacent cells nor cells situated on the selected lines are switched. This method is also referred to as the "half-select" method.

MRAM cells are read via the determination of the resistance of the respective MTJs. Given parallel orientation of the magnetization directions of a soft magnetic layer ML-free and a hard magnetic layer ML-fixed, a (tunneling) resistance of the cell is small, whereas the resistance is large given anti-parallel orientation. Consequently, it is possible, as indicated in FIG. 1 to assign a logic "1" to the parallel orientation of the magnetization directions of the soft magnetic layer ML-free and the hard magnetic layer ML-fixed and a logic "0" to the anti-parallel orientation of the magnetization directions.

In the event of a memory cell MTJ being written to too often, ageing of the cells will register. Therefore, as the number of write cycles rises, the difference in the resistance of the memory cells MTJ in each case between parallel orientation ("1") and anti-parallel orientation ("0") decreases and thus the information content of the cell becomes more and more difficult to determine. Moreover, it is often observed that cells to be written to do not switch reliably. These problems cannot be solved by the "half-select" method used hitherto, nor are any other solutions known.

The problems arising in the prior art will be explained in even more detail below with reference to FIG. 2 by way of example when writing a logic "1". In the absence of an external field, the magnetization in thin magnetic layers (in this case of the soft magnetic layer ML-free) is oriented along a distinguished direction, the so-called easy axis, which is depicted by dashes in FIG. 2A-2E. The solid bold arrow in FIGS. 2A and 2B thus gives the magnetization direction (of the soft magnetic layer ML-free) of the magnetoresistive memory cell MTJ as long as there is no effect of an external magnetic field generated by a current in the bit line BL and/or the word line WL. In order to change the (quiescent) magnetization direction indicated by the solid bold arrow in FIGS. 2A and 2B, it is necessary to apply an external field which lies outside the switching range indicated by the hatched area (the so-called asteroid). If switching is effected with only one field component (for example $H_x$), relatively large fields are required. By contrast, if the two field components $H_x$ and $H_y$ are used, fields having smaller magnitudes are required for switching.

Consequently, in accordance with FIGS. 2B and 2C, a magnetic field with a component $H_x$ and $H_y$ is generated by the current $I_{WL}$ flowing in the word line WL and the current $I_{BL}$ flowing in the bit line BL (broken arrow in FIG. 2B). This field must be present until the magnetization direction (solid bold arrow) is oriented along the direction of the magnetic field generated by the currents $I_{WL}$ and $I_{BL}$ (FIG. 2C). The two currents $I_{WL}$ and $I_{BL}$ are then switched off, and a magnetic field is no longer present externally (FIG. 2D). It is then hoped that the magnetization direction (solid bold arrow) assumes the orientation outlined in FIG. 2E, antiparallel with respect to the initial state (the quiescent magnetization direction in accordance with FIG. 2A). This method, as already mentioned, is not reliable and leads to the ageing of the cell.

Figure 3B:
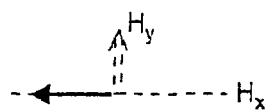
Figure 3C:
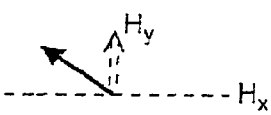
Figure 3D:
Figure 3E:
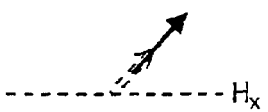
Figure 3F:
Figure 3G:
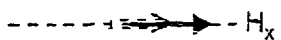
Figure 3H:
Figure 4:
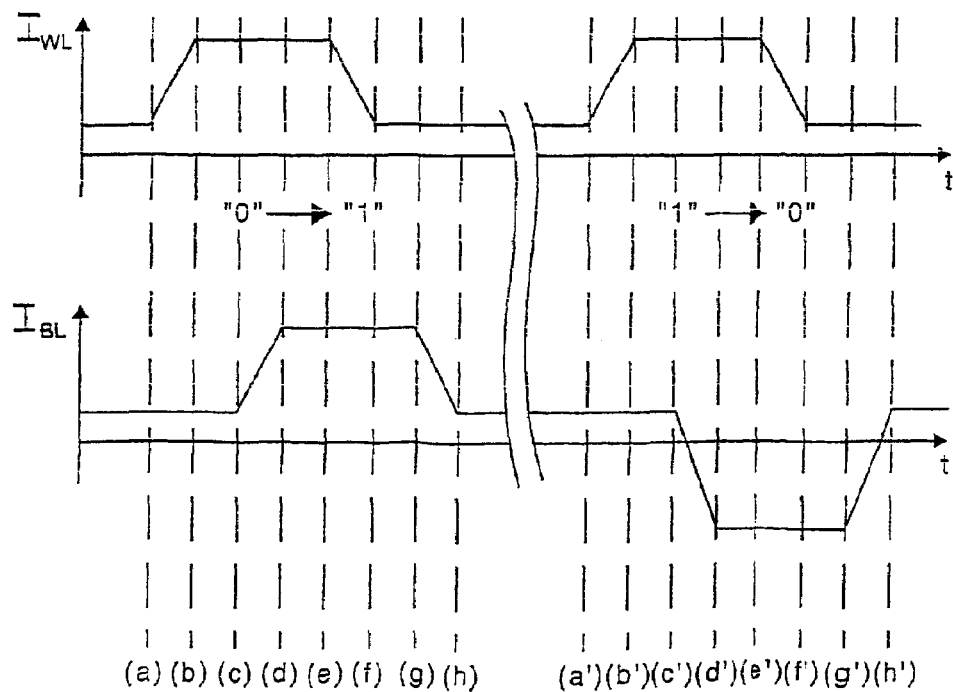
FIG. 4 is a graph showing the conversion of the method graphically illustrated in FIGS. 3A-3H into a pulse timing diagram which illustrates the mutually temporally offset current pulses through the word line and the bit line in each case when writing a logic "1" and a logic "0"

In the case of a writing method according to the invention—illustrated graphically in FIGS. 3A-3H and by a pulse timing diagram in FIG. 4—for writing to magnetoresistive memory cells of an MRAM memory, the field components $H_x$ and $H_y$ or the times of impressing the word line and bit line currents $I_{WL}$ and $I_{BL}$ are controlled exactly in such a way that the "switching"—which takes place in the known half-select method—of the magnetization is transferred into a magnetization rotation process, which operates significantly more reliably and with greater endurance.

In the graphical representations of FIG. 3A to FIG. 3H, which illustrate the temporal sequence of the rotation of the magnetization when writing a logic "1", for simplification the asteroid is omitted and only the easy axis is indicated by a dashed straight line. As in FIGS. 2A-2E, the magnetization of the memory cell MTJ is represented by a bold black arrow and the magnetic field which is composed of the magnetic field components $H_y$ and $H_x$ and is induced by the word line current $I_{WL}$ and the bit line current $I_{BL}$ is represented by a doubly dashed arrow. FIG. 3A illustrates the initial situation, which corresponds to the initial situation illustrated in FIG. 2A. In FIGS. 3B and 3C, a magnetic field $H_y$ is first present only in the y-direction, in a manner induced by the currents $I_{WL}$ and $I_{BL}$, which magnetic field first rotates the magnetization of the MRAM memory cell MTJ through an angle of between 0° and 90° (FIG. 3C). Then, if the two currents $I_{WL}$ and $I_{BL}$ flow, the magnetic field is generated with components $H_x$ and $H_y$ of approximately the same magnitude in the x-direction and y-direction, as a result of which the magnetization direction (bold arrow) rotates further and assumes an angle in the range between 90° and 180° (FIG. 3E). Finally, through a magnetic field which has a component H, pointing only in the x-direction, the magnetization direction is rotated further in accordance with FIGS. 3F and 3G until it is finally rotated in the x-direction (180°). FIG. 3H shows the de-energized end state, which specifies the information content in accordance with a logic "1" of the MRAM memory cell MTJ.

The timing diagram in FIG. 4 shows, in its left-hand half, the time sequence a-h of the word line current $I_{WL}$ and of the bit line current $I_{BL}$ for writing a logic 1, and the instants a-h correspond to the sequence, shown in FIGS. 3A-3H, of the magnetization which rotates as a result, as was described above.

The right-hand half of FIG. 4 shows, in the same way, steps a'-h' of the temporal sequence of the currents $I_{WL}$ and $I_{BL}$ for writing a logic "0" to an MRAM memory cell MTJ. It is evident that, between the instants c' and h', the bit line current $I_{BL}$ flows in the opposite direction through the bit line BL.

Figure 5A:
FIGS. 5A-5H are illustrations showing an exemplary embodiment of a writing method for writing a logic "0" according to the invention by application of a temporally controlled external magnetic field.
Figure 5B:
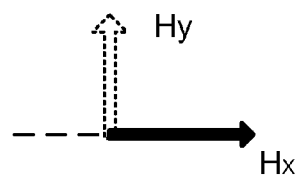
Figure 5C:
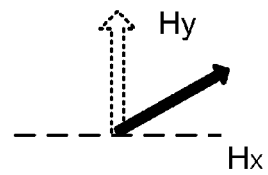
Figure 5D:
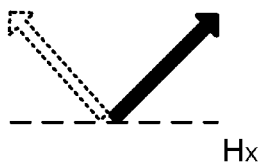
Figure 5E:
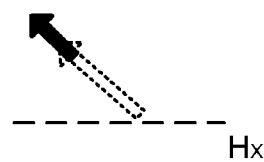
Figure 5F:
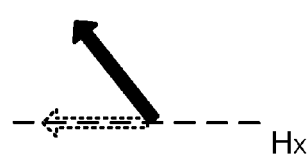
Figure 5G:
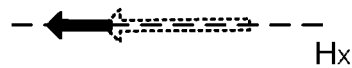
Figure 5H:

In the graphical representations of FIG. 5A to FIG. 5H, which illustrate the temporal sequence of the rotation of the magnetization when writing a logic "0", for simplification the asteroid is omitted and only the easy axis is indicated by a dashed straight line. As in FIGS. 3A-3H, the magnetization of the memory cell MTJ is represented by a bold black arrow and the magnetic field which is composed of the magnetic field components $H_y$ and $H_x$ and is induced by the word line current $I_{WL}$ and the bit line current $I_{BL}$ is represented by a doubly dashed arrow. FIG. 5A illustrates the initial situation. In FIGS. 5B and 5C, a magnetic field $H_y$ is first present only in the y-direction, in a manner induced by the currents $I_{WL}$ and $I_{BL}$, which magnetic field first rotates the magnetization of the MRAM memory cell MTJ through an angle of between 180° and 90° (FIG. 5C). Then, if the two currents $I_{WL}$ and $I_{BL}$ flow, the magnetic field is generated with components $H_x$ and $H_y$ of approximately the same magnitude in the x-direction and y-direction, as a result of which the magnetization direction (bold arrow) rotates further and assumes an angle in the range between 90° and 0° (FIG. 5E). Finally, through a magnetic field which has a component $H_x$ pointing only in the x-direction, the magnetization direction is rotated further in accordance with FIGS. 5F and 5G until it is finally rotated in the x-direction (0°). FIG. 5H shows the de-energized end state, which specifies the information content in accordance with a logic "0" of the MRAM memory cell MTJ.

In order to carry out the stepwise magnetization rotation proposed in accordance with the invention, it is thus absolutely necessary that the current $I_{WL}$ through the word line WL and the current $I_{BL}$ through the bit line BL are offset in a defined manner temporally with respect to one another. By way of example, if the word line current and the bit line current have the same switched-on duration, then the bit line current $I_{BL}$ can e.g. be applied in a manner delayed for instance by half the switching-on duration relative to the word line current $I_{WL}$, the current flow direction of the bit line current $I_{BL}$ when writing a logic "0" being reversed relative to the current flow direction of $I_{BL}$ when writing a logic "1".

The controlled rotation—according to the invention and described above with reference to the figures—of the magnetization of the MRAM memory cell MTJ avoids the ageing phenomenon which occurs in the case of the known half-select method, thereby prolongs the service life of the MRAM cells and switches more reliably in comparison with the conventional method.

With knowledge of the above-described method according to the invention, a person skilled in the art can readily specify a writing control circuit for an MRAM memory that can be written to by the method according to the invention. That is to say a circuit which impress the write currents $I_{WL}$ and $I_{BL}$ through the word line WL and the bit line BL in a manner temporally offset with respect to one another, as illustrated by way of example in FIG. 4, with the result that the magnetization direction of the selected memory cell is rotated in a plurality of successive steps in the direction desired in each case for writing a logic "0" or "1".

We claim:

1. A method for writing to magnetoresistive memory cells of an MRAM memory, the magnetoresistive memory cells having a multilayer system containing layers stacked one above another, the layers including a soft-magnetic layer, a hard-magnetic layer and a tunnel oxide layer disposed between the soft-magnetic layer and the hard-magnetic layer, which comprises the steps of:

impressing write currents being in each case impressed on a respective word line and a respective bit line resulting in a superposition of magnetic fields generated by the write currents, and in each selected memory cell selected by the respective word line and the respective bit line, a magnetic field leads to a change of a magnetization direction of only the soft-magnetic layer, the write currents being impressed on the respective word line and the respective bit line causing a magnetic field produced by the superposition of only a magnetic field of the respective word line current and a magnetic field of the respective bit line current to be precisely large enough to suffice for switching the magnetization of the soft magnetic layer in the selected memory cell but small enough that neither adjacent cells nor non-selected memory cells situated on selected lines are switched, the timings of the impression of both the respective word line current and the respective bit line current being controlled to be offset to one another by a part of the switching duration of at least the word line current for rotating the magnetization direction of the soft magnetic layer writing a logic "0" and "1", respectively, in three successive incremental angular displacement steps, wherein for writing a logic "0" that magnetization direction is rotated in three first steps in a first angular direction, and for writing a logic "1" the magnetization direction is rotated three second steps in a second inverse direction.

2. The method according to claim 1, which further comprises impressing the write currents for the selected memory cell in each case in approximately a same duration and in a manner offset in time with respect to one another by half of their switching duration.

3. An MRAM memory configuration, comprising:
an array containing magnetoresistive memory cells each having a multilayer system with layers stacked one above another, said layers including a soft-magnetic layer, a hard-magnetic layer, and a tunnel oxide layer disposed between said soft-magnetic layer and said hard-magnetic layer;
word lines;
bits lines crossing said word lines at each of said magnetoresistive memory cells; and
a writing control circuit for impressing write currents in each case onto a respective word line and a respective bit line of a respective memory cell selected for writing, said writing control circuit having a write circuit for impressing the write currents in each case on said respective word line and said respective bit line causing a magnetic field produced by the superposition of only a magnetic field of the respective word line current and a magnetic field of the respective bit line current to be precisely large enough to suffice for rotating a magnetization direction of the soft magnetic layer in the selected memory cell but small enough that neither adjacent cells nor non-selected memory cells situated on selected lines are switched, said write circuit controlling the timings of the impression of both said respective word line current and said respective bit line current to be offset to one another by a part of the switching duration of at least the word line current for rotating the magnetization direction of the soft magnetic layer of the respective memory cell for writing a logic "0" and "1", respectively, in three successive incremental angular displacement steps, wherein for writing a logic "0" said write circuit rotates the magnetization direction in three first steps in a first angular direction and for writing a logic "1" said write circuit rotates the magnetization direction in three second steps in a second inverse angular direction.

4. The method according to claim 1, wherein in order to write a logic "1" to the selected memory cell the write current in the bit line is impressed in the same current flow direction as the flowing of the write current of the word line and is impressed in a delayed manner relative to the write current of the word line.

5. The method according to claim 2, wherein in order to write a logic "1" to the selected memory cell the write current in the bit line is impressed in the same current flow direction as the flowing of the write current of the word line and is impressed in a delayed manner relative to the write current of the word line.

6. The method according to claim 1, wherein the plurality of successive angular displacement steps of the rotation of the magnetization direction of the soft magnetic layer comprises:
a first rotating step, when the write current flows only in the word line for rotating the magnetization direction of the soft magnetic layer of the selected memory cell by an angle between 0° and 90° with respect to its original magnetization direction;
a second rotating step, when the write currents flow in both the word line and the bit line for rotating the magnetization direction of the soft magnetic layer of the selected memory cell by an angle between 90° and 180° with respect to its original magnetization direction; and
a third rotation step, when the write current flows only in the bit line for further rotating the magnetization direction of the soft magnetic layer into the desired final state in which the magnetization direction of the soft magnetic material differs by 180° with respect to its original magnetization direction.

* * * * *